United States Patent
Pendse

(10) Patent No.: US 8,217,514 B2
(45) Date of Patent: Jul. 10, 2012

(54) INTEGRATED CIRCUIT PACKAGING SYSTEM WITH WARPAGE CONTROL SYSTEM AND METHOD OF MANUFACTURE THEREOF

(75) Inventor: Rajendra D. Pendse, Fremont, CA (US)

(73) Assignee: Stats Chippac Ltd., Singapore (SG)

(*) Notice: Subject to any disclaimer, the term of this patent is extended or adjusted under 35 U.S.C. 154(b) by 96 days.

(21) Appl. No.: 12/412,303

(22) Filed: Mar. 26, 2009

(65) Prior Publication Data
US 2009/0250810 A1 Oct. 8, 2009

Related U.S. Application Data

(60) Provisional application No. 61/043,123, filed on Apr. 7, 2008.

(51) Int. Cl.
 H01L 23/00 (2006.01)
 H01L 21/52 (2006.01)
 H01L 21/56 (2006.01)
(52) U.S. Cl. ............. 257/723; 257/E21.5; 257/E21.503; 257/E23.002; 257/778; 257/737; 257/783; 257/685; 438/118; 438/127
(58) Field of Classification Search .................. 257/778, 257/737, 723, E21.503, E23.002, 685, 783; 438/127, 118
See application file for complete search history.

(56) References Cited

U.S. PATENT DOCUMENTS

| | | | | |
|---|---|---|---|---|
| 4,963,701 A | * | 10/1990 | Yasumoto et al. | 174/256 |
| 5,173,766 A | * | 12/1992 | Long et al. | 257/687 |
| 6,104,464 A | * | 8/2000 | Adachi et al. | 349/150 |
| 6,413,353 B2 | | 7/2002 | Pompeo et al. | |
| 6,596,561 B2 | * | 7/2003 | Takahashi et al. | 438/113 |
| 6,625,036 B1 | * | 9/2003 | Horio | 361/760 |
| 6,791,178 B2 | * | 9/2004 | Yamaguchi et al. | 257/699 |
| 7,208,342 B2 | | 4/2007 | Lee et al. | |
| 7,247,556 B2 | | 7/2007 | Nanda et al. | |
| 7,279,792 B2 | * | 10/2007 | Naya | 257/758 |
| 7,317,254 B2 | | 1/2008 | Horie | |
| 7,327,040 B2 | * | 2/2008 | Aoki et al. | 257/778 |
| 7,462,943 B2 | | 12/2008 | Ancheta, Jr. et al. | |
| 7,473,618 B1 | | 1/2009 | Danovitch et al. | |
| 7,494,892 B2 | | 2/2009 | Ishibashi et al. | |
| 7,498,213 B2 | | 3/2009 | Kim et al. | |
| 2004/0227236 A1 | * | 11/2004 | Sawamoto | 257/734 |
| 2005/0035440 A1 | | 2/2005 | Mohammed | |
| 2006/0012967 A1 | * | 1/2006 | Asai et al. | 361/764 |
| 2007/0235884 A1 | * | 10/2007 | Hsu | 257/778 |
| 2008/0055873 A1 | * | 3/2008 | Mi et al. | 361/761 |
| 2008/0067661 A1 | * | 3/2008 | Kawabata | 257/686 |
| 2008/0089048 A1 | * | 4/2008 | Yamano et al. | 361/812 |
| 2008/0224608 A1 | * | 9/2008 | Konishi et al. | 313/505 |
| 2009/0001606 A1 | * | 1/2009 | Tamadate | 257/778 |
| 2009/0028491 A1 | * | 1/2009 | Fillion et al. | 385/14 |
| 2009/0052150 A1 | * | 2/2009 | Kobayashi | 361/767 |
| 2009/0091031 A1 | * | 4/2009 | Takahashi et al. | 257/737 |
| 2009/0175017 A1 | * | 7/2009 | Kita et al. | 361/792 |
| 2010/0224974 A1 | * | 9/2010 | Shim et al. | 257/685 |
| 2011/0233771 A1 | * | 9/2011 | Kwon et al. | 257/737 |

* cited by examiner

*Primary Examiner* — A O Williams
(74) *Attorney, Agent, or Firm* — Ishimaru & Associates LLP; Mikio Ishimaru; Stanley Chang

(57) ABSTRACT

A method of manufacture of an integrated circuit packaging system is provided including: providing a substrate; placing a patterned layer over the substrate for substantially removing crying warpage from the substrate, the patterned layer having an opening surrounded by other openings with the substrate exposed from the patterned layer within the other openings; mounting a semiconductor chip within the opening; and attaching a component directly over the other openings, the component having a horizontal length greater than horizontal lengths of the other openings.

20 Claims, 4 Drawing Sheets

INTEGRATED CIRCUIT PACKAGING SYSTEM WITH WARPAGE CONTROL SYSTEM AND METHOD OF MANUFACTURE THEREOF

CROSS-REFERENCE TO RELATED APPLICATION(S)

This application claims the benefit of U.S. Provisional Patent Application Ser. No. 61/043,123 filed Apr. 7, 2008, and the subject matter thereof is incorporated herein by reference thereto.

TECHNICAL FIELD

The present invention relates generally to integrated circuit package systems, and more particularly to integrated circuit warpage control system.

BACKGROUND ART

In the electronics industry, the tendency has been to reduce the size of electronic devices such as camcorders and portable telephones while increasing performance and speed. Integrated circuit packages for complex systems typically are comprised of multiple interconnected integrated circuit chips. The integrated circuit chips usually are made from a semiconductor material such as silicon or gallium arsenide. The integrated circuit chips may be mounted in packages that are then mounted on printed wiring boards.

This increased integrated circuit density has led to the development of multi-chip packages, a package in package (PIP), a package on package (POP), or a combination thereof in which more than one integrated circuit can be packaged. Each package provides mechanical support for the individual integrated circuits and one or more layers of interconnect lines that enable the integrated circuits to be connected electrically to surrounding circuitry.

Typically, the packages on which the integrated semiconductor chips are mounted include a substrate or other chip-mounting device. Substrates are parts that provide a package with mechanical base support and a form of electrical interface that would allow the external world to access the devices housed within the package.

Current multi-chip packages, also commonly referred to as multi-chip modules, typically consist of a substrate onto which a set of separate integrated circuit components are attached. Such multi-chip packages have been found to increase integrated circuit density and miniaturization, improve signal propagation speed, reduce overall integrated circuit size and weight, improve performance, and lower costs all of which are primary goals and the modern trend of the integrate circuit industry.

Unfortunately, package warpage is a critical problem in multi-chip and multi-package packaging as well as single die packaging for large body sizes. In particular, for Package-on-Package (PoP) technology where typical flip chip interconnection is employed to interconnect the semiconductor chip to the base package, warpage of the base package has become a significant limitation making it unfeasible to meet typical warpage specifications for such packages.

In a typical flip chip package, a negative curvature ("crying" warpage) results after the chip attach and the underfill processes are completed. This is expected due to the coefficient of thermal expansion (CTE) mismatch between semiconductor chip and the substrate. The goal of the warpage control is to have the combination of the chip and the substrate as flat as possible. Since absolute flatness is impossible to achieve, typically, strict warpage specification is imposed. The curvature described above makes it difficult to meet the warpage specifications, particularly in case of 3-dimension (3D) packages like PoPb (PoP base package) for which the specifications are unusually stringent.

Thus, a need still remains for accommodating the modern trend of semiconductor manufacturing and packaging, achieving better control the package warpage, and increasing the packaging density. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; and placing a patterned layer over the substrate for substantially removing crying warpage from the substrate.

The present invention provides an integrated circuit packaging system including: a substrate; and a patterned layer over the substrate for substantially removing crying warpage from the substrate.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
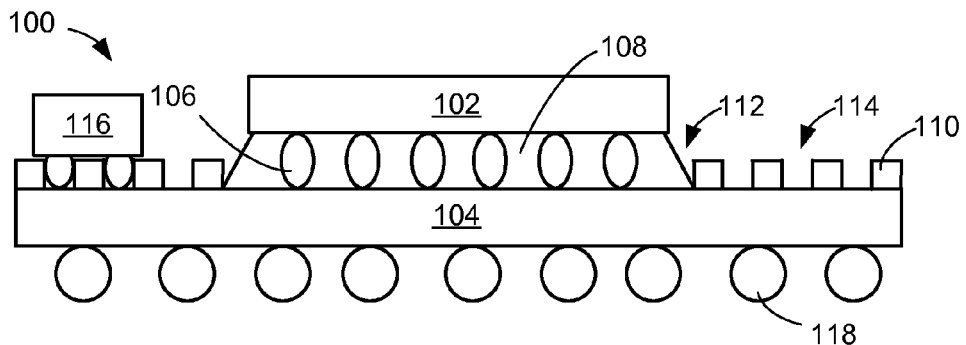
FIG. 1 is a cross-sectional view of a semiconductor package system of a first embodiment of the present invention along line 1-1 of FIG. 2.

The following embodiments are described in sufficient details to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings generally show similar orientations for ease of description, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the semiconductor substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the drawings. The term "on" means that there is direct contact among elements.

The term "processing" as used herein includes deposition of material or photoresist, patterning, exposure, development, etching, cleaning, and/or removal of the material or photoresist as required in forming a described structure.

Figure 2:
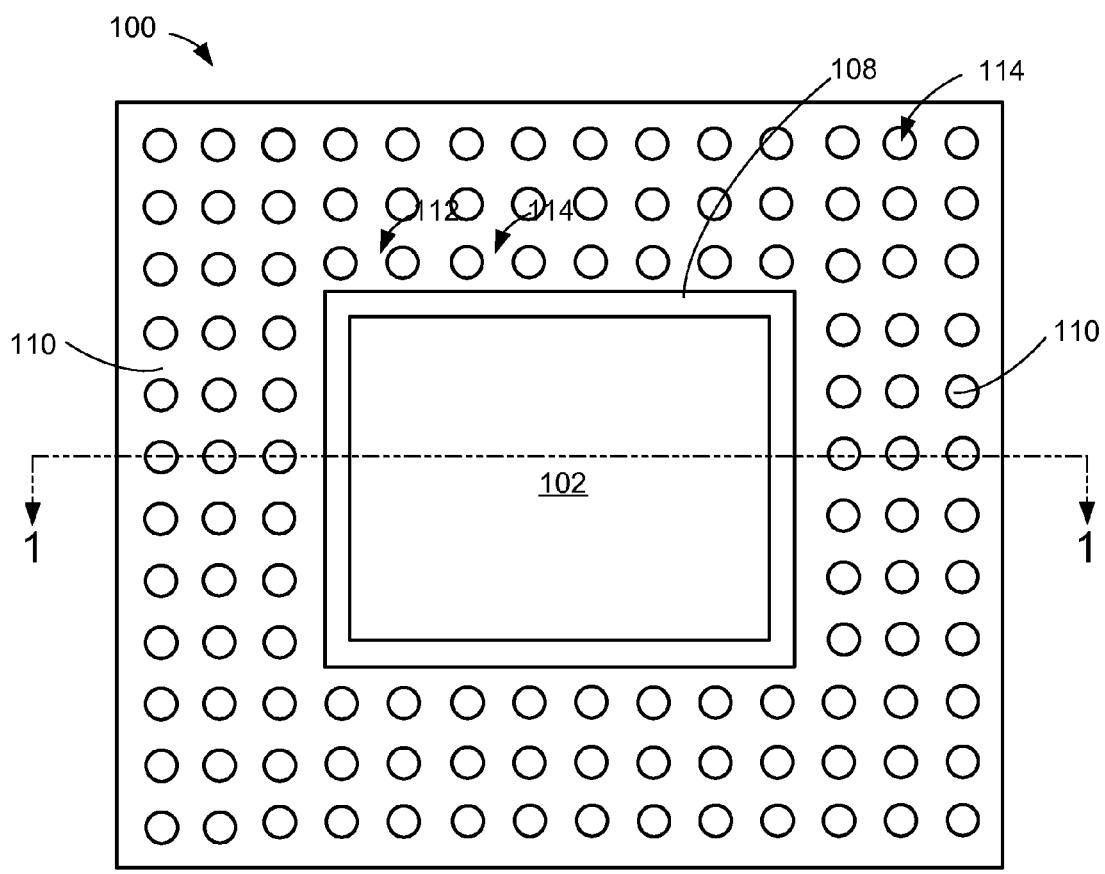
FIG. 2 is a top view of the semiconductor package system of the first embodiment of the present invention.

Referring now to FIG. 1, therein is shown a cross-sectional view of a semiconductor package system of a first embodiment of the present invention along line 1-1 of FIG. 2.

A semiconductor package 100 is shown to have a semiconductor chip 102 attached to a substrate 104 through interconnecting solder bumps 106. The semiconductor chip 102 could be a flip chip or other types of semiconductor chips. The substrate 104 could be a solid structure or a laminated structure. The interconnecting solder bumps 106 are sometimes encapsulated in a die attach adhesive or underfill 108.

A patterned resin layer 110 is formed on the substrate 104. In the simplest form, the pattern of the patterned resin layer 110 has a square or rectangle 112 in the center around the semiconductor chip 102. The semiconductor chip 102 can be mounted within an opening, depicted as the square or rectangle 112. In a more complex form, the patterned resin layer has other openings 114 for attaching further components 116 above the substrate 104. The further components 116 can be attached directly over the other openings 114. The further components 116 can include a horizontal length greater than horizontal lengths of the other openings 114.

The patterned resin layer 110 could be made from many different resins including solder resist material, which is commonly used in substrate manufacturing. It is found that two or more applications of the solder resist material may be a cost effective way to apply the patterned resin layer 110.

In typical configurations involving a flip chip, a "crying" warpage or negative curvature with the edges of the substrate 104 bending downward from the center of the substrate 104 results. This result is expected due to the coefficient of thermal expansion (CTE) mismatch between silicon of the semiconductor chip 102 and the solid or laminated structure of the substrate 104.

The goal of packaging is to have the combination of the semiconductor chip 102 and the substrate 104 as flat as possible. Since absolute flatness is impossible to achieve, typically, strict warpage specifications are imposed. The negative curvature described above makes it difficult to meet the warpage specifications, particularly in case of 3D packages for which the specifications are unusually stringent.

In embodiments of the present invention, the patterned resin layer 110 is added to substantially remove crying warpage. It has been discovered that the CTE value, filler loading, curing shrinkage factor, thickness, and area of coverage of the resin material of the patterned resin layer 110 can be used to induce a "reverse" warpage that effectively offsets or neutralizes the effect of the original crying warpage, resulting in a substantially warpage-free package.

It has also been discovered that suitable combinations of the CTE value, filler loading, curing shrinkage factor, thickness, and area of coverage of the resin material can all be determined without undue experimentation by the simple expedient of forming a layer of resin material in the desired pattern, modifying one of the variables, and watching the resultant removal of crying warpage from the final package.

Generally, it has been discovered that increasing CTE value, lower filler loading, higher curing shrinkage factor, greater thickness, and increased area of coverage tend to increase reverse warpage but some combinations are better than others for different substrates and semiconductor chip combinations.

It has been found that the application of the patterned resin layer 110 effectively solves the crying warpage problem, facilitates and accommodates fulfillment of the warpage specifications, and improves reliability of the semiconductor package system.

Thus, it has been discovered that the integrated circuit packaging system of the present invention furnishes important and heretofore unknown and unavailable solutions, capabilities, and functional aspects for increasing functionality integration, increasing packing density, reducing processing and manufacturing complexity, reducing cost, and enhancing reliability.

A base package solder ball 118 is attached to the bottom surface of the substrate 104 as a further step of assembly.

Referring now to FIG. 2, therein is shown a top view of the semiconductor package system of the first embodiment of the present invention. The patterned resin layer 110 can include an opening, depicted as the square or rectangle 112, with more than two sides surrounded by the other openings 114 with the substrate 104 of FIG. 1 exposed from the patterned resin layer 110 within the other openings 114. The other openings 114 can be separated by a horizontal distance between the centers of adjacent instances of the other openings 114, which is referred to as horizontal lengths of the other openings 114.

The semiconductor package 100 is shown to have the semiconductor chip 102 on the underfill 108. The patterned resin layer 110 is also shown around the semiconductor chip 102. The shape and layout of the patterned resin layer 110 are designed to remove the warpage of the package. Depending on the specific requirement for different packaging systems, the shape and layout of the patterned resin layer 110 will change accordingly.

Figure 3:
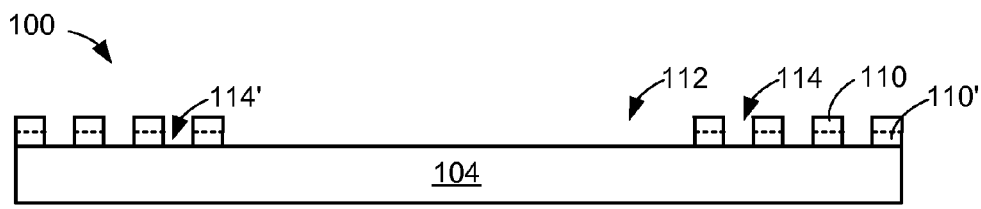
FIG. 3 is a cross-sectional view similar to FIG. 1 of the semiconductor package system of the first embodiment of the present invention after a resin patterning stage of the process.

Referring now to FIG. 3, therein is shown a cross-sectional view similar to FIG. 1 of the semiconductor package system 100 of the first embodiment of the present invention after a resin patterning stage of the process.

The substrate 104 is provided. The patterned resin layer 110 is then formed on top of the substrate 104. The formation of the patterned resin layer 110 could be through a screen printing process. Also shown is a patterned solder resist layer 110', which would be an optional solder resist layer upon which the patterned resin layer 110 is deposited to offset the crying warpage.

The size of the other openings 114 in the patterned resin layer 110 can be of a different size from solder openings 114' in the patterned solder resist layer 110'. It has been discovered that difference in sizes between the other openings 114 and the solder openings 114' would help prevent solder "wicking" out of the solder openings 114' because the surface tension of solder tends to form a sphere while the solder openings 114' are cylindrical or box shaped. By having the other openings 114 larger than the openings 114', more of a spherical opening is formed, which prevents solder wicking.

Other processes could also be used to form the patterned resin layer 110.

Figure 4:
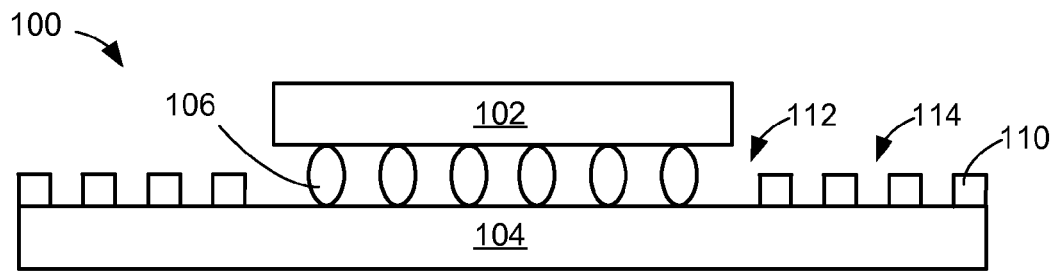
FIG. 4 is a cross-sectional view of FIG. 3 after a chip attaching stage of the process.

Referring now to FIG. 4, therein is shown a cross-sectional view of FIG. 3 after a chip attaching stage of the process.

The semiconductor chip 102 is then attached to the substrate 104 through the interconnecting solder bump 106. The semiconductor chip 102 could be a flip chip.

Figure 5:
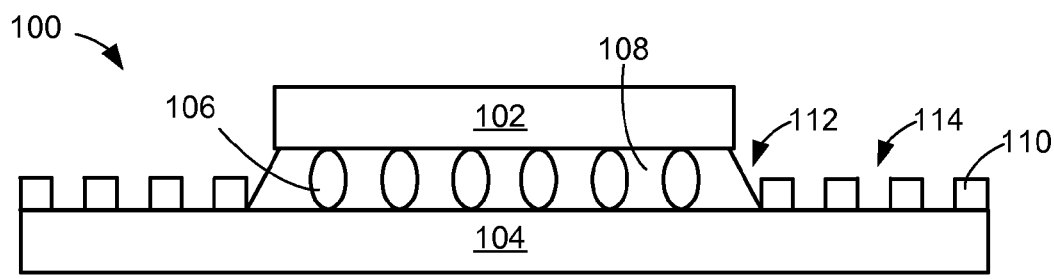
FIG. 5 is a cross-sectional view of FIG. 4 after an underfilling stage of the process.

Referring now to FIG. 5, therein is shown a cross-sectional view of FIG. 4 after an underfilling stage of the process.

The die attach adhesive or underfill 108 is used to encapsulate the interconnecting solder bump 106. The die attach adhesive or underfill 108 could be a type of resin.

It has been discovered that the patterned resin layer 110 suitably designed with appropriate thickness could serve to provide a "dam" for limiting bleed of the die attach adhesive or underfill 108, thus resulting in improved reliability of the semiconductor package system.

The appropriate thickness can be determined without undue experimentation by to determining at what thickness of patterned resin layer 110 that the die attach adhesive or underfill 108 will stop flowing over the patterned resin layer 110.

Conversely, the amounts of die attach adhesive or underfill 108 could be tested to determine the amount at which the flow over the patterned resin layer will not occur.

It has been discovered that by increasing the thickness of the patterned resin layer 110 to increase the height of the dam, the rectangle 112 around the semiconductor chip 102 can be made smaller. This means that the die attach adhesive or underfill 108 takes up less area on the substrate 104, which further means that the semiconductor package can be made smaller.

Further, it has been discovered that the patterned resin layer 110 can position the further components 116 and control the collapse height of solder bumps on the further components 116. Both the sizes of the other openings 114 as well as the thickness of the patterned resin layer 100 will set the height of the further components 116 above the substrate 104.

Figure 6:
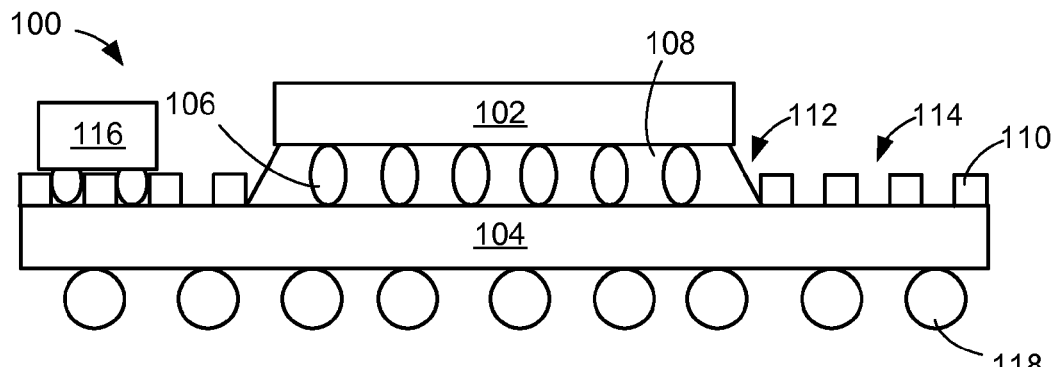
FIG. 6 is a cross-sectional view of FIG. 5 after a solder ball attaching stage of the process.

Referring now to FIG. 6, therein is shown a cross-sectional view of FIG. 5 after a solder ball attaching stage of the process.

The base package solder balls 116 are then attached to the bottom surface of the substrate 104. Connections between the bottom surface and top surface exist but are not shown for clarity.

Figure 7:
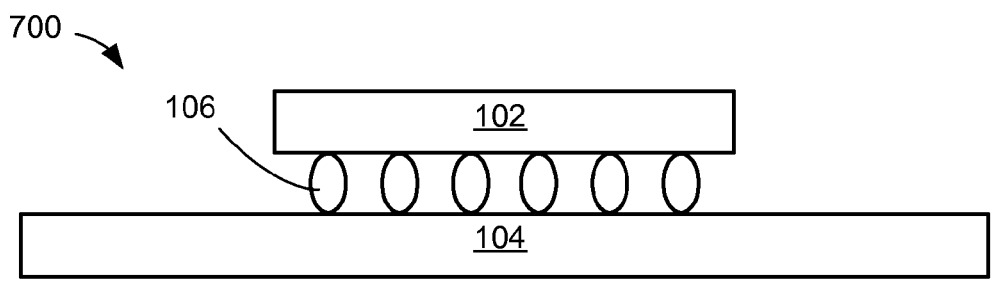
FIG. 7 is a cross-sectional view similar to FIG. 1 of the semiconductor package system of a second embodiment of the present invention after a chip attaching stage of the process.

Referring now to FIG. 7, therein is shown a cross-sectional view similar to FIG. 1 of the semiconductor package system of a second embodiment of the present invention after a chip attaching stage of the process.

A semiconductor package 700 is shown to have the semiconductor chip 102 attached to the substrate 104 through the interconnecting solder bump 106.

Figure 8:
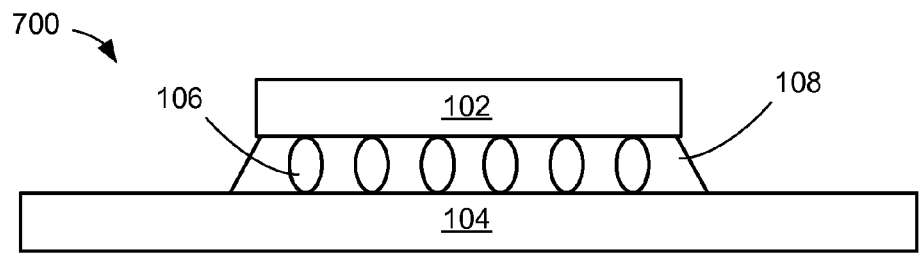
FIG. 8 is a cross-sectional view of FIG. 7 after an underfilling stage of the process.

Referring now to FIG. 8, therein is shown a cross-sectional view of FIG. 7 after an underfilling stage of the process.

The die attach adhesive or underfill 108 is then used to encapsulate the interconnecting solder bump 106. The die attach adhesive or underfill 108 could be a type of resin.

Figure 9:
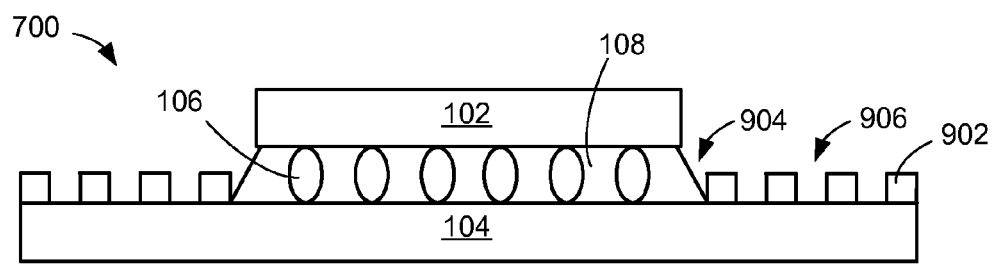
FIG. 9 is a cross-sectional view of FIG. 8 after a resin patterning stage of the process.

Referring now to FIG. 9, therein is shown a cross-sectional view of FIG. 8 after a resin patterning stage of the process.

A patterned resin layer 902 is then formed on top of the substrate 104. The formation of the patterned resin layer 902 could be through a line dispenser process laying down crossing strips of the patterned resin layer 902. An opening 904 would be formed as a square or rectangle around the semiconductor chip 102 and underfill 108, and other openings 906 would be formed as squares or rectangles for attaching further components 116 above the substrate 104.

Other processes could also be used to form the patterned resin layer 902.

Figure 10:
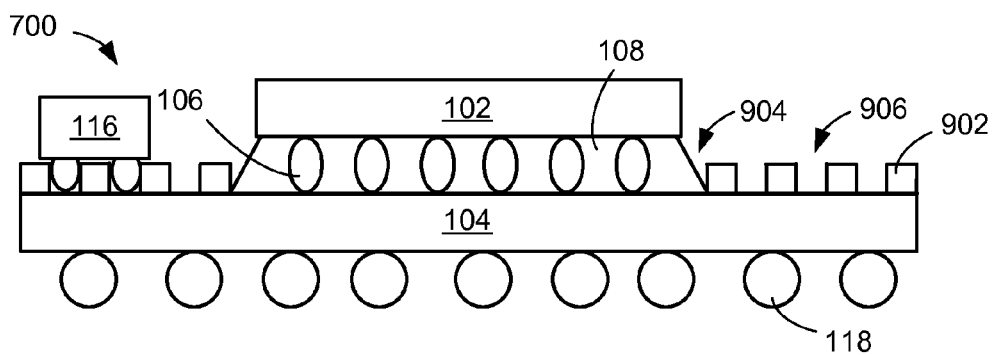
FIG. 10 is a cross-sectional view of FIG. 9 after a solder ball attaching stage of the process.

Referring now to FIG. 10, therein is shown a cross-sectional view of FIG. 9 after a solder ball attaching stage of the process.

The base package solder ball 112 is then attached to the bottom surface of the substrate 104.

Figure 11:
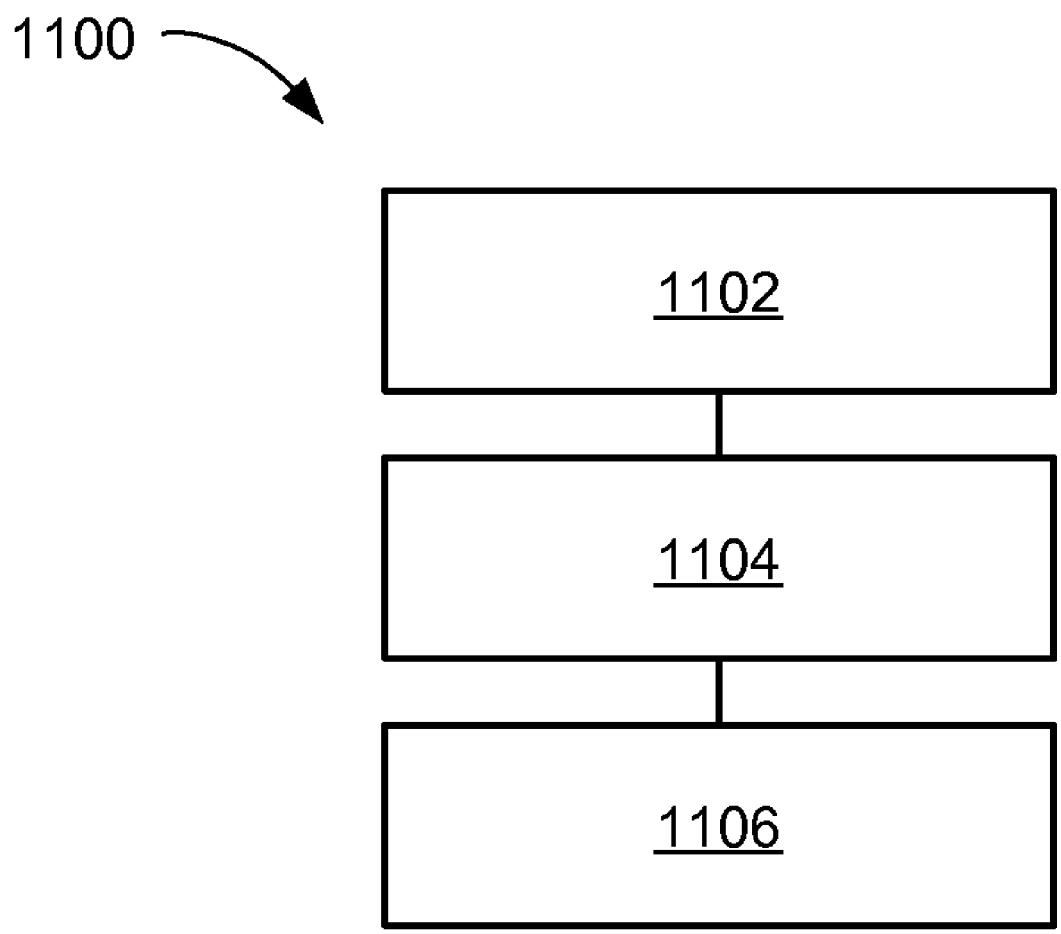
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: providing a substrate in a block 1102; mounting a semiconductor chip on the substrate in a block 1104; and placing a patterned material on the substrate around the semiconductor chip for removing the warpage of the substrate in a block 1106.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing semiconductor packaging systems fully compatible with conventional manufacturing processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:

providing a substrate;
placing a patterned layer over the substrate for substantially removing crying warpage from the substrate, the patterned layer having a central opening with more than two sides surrounded by other openings having equal spacing of horizontally and vertically adjacent instances with the substrate exposed from the patterned layer within the other openings;
mounting a semiconductor chip within the opening; and
attaching a component directly over the other openings, the component having a horizontal length greater than horizontal lengths of the other openings.

2. The method as claimed in claim 1 wherein:
placing the patterned layer includes patterning during or after placing the patterned layer.

3. The method as claimed in claim 1 further comprising:
attaching a die attach adhesive to the semiconductor chip and the substrate under the semiconductor chip; and
forming the patterned layer around the semiconductor chip to a thickness to dam the die attach adhesive.

4. The method as claimed in claim 1 further comprising:
placing a patterned solder resist layer on the substrate; and
wherein:
placing the patterned layer includes placing the patterned layer on the patterned solder resist layer.

5. The method as claimed in claim 1 further comprising adjusting thickness or area of coverage of the patterned layer for substantially removing crying warpage.

6. A method of manufacture of an integrated circuit packaging system comprising:
providing a substrate;
placing a patterned layer dyer the substrate for substantially removing crying warpage from the substrate, the patterned layer having a central opening in the center thereof and with more than two sides surrounded by other openings having equal spacing of horizontally and vertically adjacent instances with the substrate exposed from the patterned layer within the other openings;
mounting a semiconductor chip within the opening; and
attaching a component directly over the other openings, the component having a horizontal length greater than horizontal lengths of the other openings.

7. The method as claimed in claim 6 wherein:
placing the patterned layer includes patterning the other openings for attaching other components during or after placing the patterned layer.

8. The method as claimed in claim 6 further comprising:
attaching a die attach adhesive to the semiconductor chip and the substrate under the semiconductor chip;
forming the patterned layer to a thickness to dam the die attach adhesive in the opening.

9. The method as claimed in claim 6 further comprising:
placing a patterned solder resist layer on the substrate, the patterned solder resist layer having solder openings; and
wherein:
placing the patterned layer includes placing the patterned layer on the patterned solder resist layer, the patterned layer having the other openings larger than the solder openings.

10. The method as claimed in claim 6 further comprising adjusting co-efficient of thermal expansion value, filler loading, curing shrinkage factor, thickness, or area of coverage of the patterned layer for substantially removing crying warpage.

11. An integrated circuit packaging system comprising:
a substrate;
a patterned layer over the substrate for substantially removing crying warpage from the substrate, the patterned layer having a central opening with more than two sides surrounded by other openings equally spaced from horizontally and vertically adjacent instances with the substrate exposed from the patterned layer within the other openings;
a semiconductor chip mounted within the opening; and
a component directly over the other openings, the component having a horizontal length greater than horizontal lengths of the other openings.

12. The system as claimed in claim 11 wherein:
the patterned layer includes the opening formed as a square or rectangle in the patterned layer.

13. The system as claimed in claim 11 further comprising:
a die attach adhesive attached to the semiconductor chip and the substrate under the semiconductor chip; and
wherein:
the patterned layer is around the semiconductor chip and formed to a thickness to dam the die attach adhesive.

14. The system as claimed in claim 11 further comprising:
a patterned solder resist layer on the substrate; and
wherein:
the patterned layer is on the patterned solder resist layer.

15. The system as claimed in claim 11 wherein the patterned layer has a thickness or area of coverage for substantially removing crying warpage.

16. The system as claimed in claim 11 wherein the patterned layer has the opening in the center thereof.

17. The system as claimed in claim 16 wherein:
the patterned layer includes the other openings for attaching other components.

18. The system as claimed in claim 16 further comprising:
a die attach adhesive attached to the semiconductor chip and the substrate under the semiconductor chip; and
wherein:
the patterned layer having a thickness to dam the die attach adhesive in the opening.

19. The system as claimed in claim 16 further comprising:
a patterned solder resist layer on the substrate, the patterned solder resist layer having solder openings; and
wherein:
the patterned layer is on the patterned solder resist layer, the patterned layer having the other openings larger than the solder openings.

20. The system as claimed in claim 16 wherein the patterned layer has a co-efficient of thermal expansion value, filler loading, curing shrinkage factor, thickness, or area of coverage of the patterned layer for substantially removing crying warpage.

* * * * *

UNITED STATES PATENT AND TRADEMARK OFFICE
CERTIFICATE OF CORRECTION

PATENT NO.        : 8,217,514 B2
APPLICATION NO.   : 12/412303
DATED             : July 10, 2012
INVENTOR(S)       : Pendse Page 1 of 1

It is certified that error appears in the above-identified patent and that said Letters Patent is hereby corrected as shown below:

In the Claims:

Column 7, Claim 6, line 32, delete "dyer" and insert therefor --over--

Signed and Sealed this
Eighteenth Day of March, 2014

Michelle K. Lee
*Deputy Director of the United States Patent and Trademark Office*